(12) United States Patent
Shrivastava et al.

(10) Patent No.: US 9,943,011 B2
(45) Date of Patent: Apr. 10, 2018

(54) COOLING CONTROL FOR DATA CENTERS WITH COLD AISLE CONTAINMENT SYSTEMS

(71) Applicant: Panduit Corp., Tinley Park, IL (US)

(72) Inventors: Saurabh K. Shrivastava, Lemont, IL (US); Mahmoud I. Ibrahim, Chicago, IL (US); Bharathkrishnan Muralidharan, Tinley Park, IL (US)

(73) Assignee: Panduit Corp., Tinley Park, IL (US)

( * ) Notice: Subject to any disclaimer, the term of this patent is extended or adjusted under 35 U.S.C. 154(b) by 234 days.

(21) Appl. No.: 14/847,711

(22) Filed: Sep. 8, 2015

(65) Prior Publication Data

US 2016/0073555 A1    Mar. 10, 2016

Related U.S. Application Data

(60) Provisional application No. 62/048,423, filed on Sep. 10, 2014.

(51) Int. Cl.
    *H05K 5/00*   (2006.01)
    *H05K 7/20*   (2006.01)
    *H05K 7/14*   (2006.01)

(52) U.S. Cl.
    CPC ....... *H05K 7/20709* (2013.01); *H05K 7/1488* (2013.01); *H05K 7/20745* (2013.01); *H05K 7/20836* (2013.01)

(58) Field of Classification Search
    CPC ...... F24F 13/0227; F24F 13/068; F24F 13/14; F24F 13/1413; F24F 13/15; F24F 13/16
    USPC ....... 454/184, 249, 289, 264–268, 347, 358; 361/694
    See application file for complete search history.

(56) References Cited

U.S. PATENT DOCUMENTS

| 4,817,865 | A | 4/1989 | Wray |
| 5,040,377 | A | 8/1991 | Braun et al. |
| 5,076,346 | A | 12/1991 | Otsuka |
| 5,467,607 | A | 11/1995 | Harvey |
| 5,474,120 | A | 12/1995 | Severson et al. |
| 5,671,805 | A | 9/1997 | Stahl et al. |
| 5,709,100 | A | 1/1998 | Baer et al. |
| 5,826,432 | A | 10/1998 | Ledbetter |
| 5,863,246 | A | 1/1999 | Bujak, Jr. |
| 6,494,050 | B2 | 12/2002 | Spinazzola et al. |
| 6,557,624 | B1 | 5/2003 | Stahl et al. |
| 6,574,104 | B2 | 6/2003 | Patel et al. |
| 6,694,759 | B1 * | 2/2004 | Bash ............... G05D 16/202 236/49.3 |

(Continued)

FOREIGN PATENT DOCUMENTS

| EP | 2770811 A2 | 8/2014 |
| WO | WO 2011/073668 A1 | 6/2011 |

OTHER PUBLICATIONS

EcoAisle Active Flow Controller User Manual, Schneider Electric, Oct. 2012.

(Continued)

*Primary Examiner* — Vivek Shirsat
(74) *Attorney, Agent, or Firm* — Christopher S. Clancy; James H. Williams; Ryan K. Thelen (57) ABSTRACT

Embodiments of the present invention generally relate to the field of data center cooling and energy management. In an embodiment of the present invention, multiple PODs within a data center are controlled by a controller via active dampers.

16 Claims, 7 Drawing Sheets

(56) References Cited

U.S. PATENT DOCUMENTS

| | | |
|---|---|---|
| 6,862,179 B2 | 3/2005 | Beitelmal et al. |
| 6,868,682 B2 | 3/2005 | Sharma et al. |
| 6,925,828 B1 | 8/2005 | Gerstner et al. |
| 7,251,547 B2 | 7/2007 | Bash et al. |
| 7,313,924 B2 | 1/2008 | Bash et al. |
| 7,861,596 B2 | 1/2011 | Bean, Jr. |
| 7,971,446 B2 | 7/2011 | Clidaras et al. |
| 8,145,363 B2 | 3/2012 | Bean, Jr. et al. |
| 8,256,305 B2 | 9/2012 | Bean, Jr. et al. |
| 2006/0091229 A1 | 5/2006 | Bash et al. |
| 2009/0277622 A1 | 11/2009 | Nair |
| 2011/0106314 A1* | 5/2011 | Beitelmal .......... H05K 7/20836 700/276 |
| 2011/0128699 A1 | 6/2011 | Heydari et al. |
| 2011/0195652 A1* | 8/2011 | Smith .................... F24F 11/008 454/184 |
| 2011/0303406 A1 | 12/2011 | Takeda et al. |
| 2012/0298219 A1 | 11/2012 | Bean, Jr. et al. |
| 2013/0264396 A1* | 10/2013 | Roe ........................ B05B 12/04 239/11 |
| 2014/0090806 A1 | 4/2014 | Colco et al. |
| 2014/0244046 A1 | 8/2014 | Zhou et al. |

OTHER PUBLICATIONS

Airflow Pressure Controller & Rack Mounting Kit drawings, Schneider Electric, Apr. 19, 2013.
EcoAisle Intelligent Containment Solutions that Increase Data Center Cooling Efficiency while Protecting Critical IT Equipment and Personnel, Schneider Electric, Sep. 9, 2014.

\* cited by examiner

COOLING CONTROL FOR DATA CENTERS WITH COLD AISLE CONTAINMENT SYSTEMS

CROSS-REFERENCE TO RELATED APPLICATIONS

This application claims the benefit of U.S. Provisional Patent Application No.: 62/048,423 filed on Sep. 10, 2014, which is incorporated herein by reference in its entirety.

BACKGROUND OF THE INVENTION

Data center cooling energy efficiency is critical to successful operation of modern large data centers. The cooling infrastructure can account for an average of 40% of the total data center energy consumption. Adopting methods to raise the efficiency of cooling in data centers can significantly affect the cost of running them, as well as extending their life. The current trend of deploying high heat load density cabinets in data centers necessitates the use of air containment systems. Many of the modern data centers use some kind of air containment systems to achieve high cooling energy efficiency. Air containment in simple terms provides physical separation between the supplied cool air and the cabinet exhaust hot air. This separation of cold and hot air results in cooling energy savings; however, in order to observe the maximum energy savings a proper control system for cooling units is required. Typically, the cooling units get controlled based on a coupled control scheme, wherein both the fan speed and the chilled water valve/compressor speed get controlled based on a single parameter, i.e., return or supply air temperature. These type of control schemes work well for data centers without containment systems but they may not be the best way to control cooling in data centers with containment systems.

In containment systems, the cooling units and the information technology (IT) equipment are tightly connected with each other via supply air plenum and aisle containment system. Therefore, it becomes important to not only have cold air available at a proper temperature but also have the cooling airflow in the correct amount at the IT equipment inlet. Use of coupled control schemes (i.e. supply air temperature or return air temperature) in containment system does not necessarily guarantee the above conditions and almost always results in either oversupply and/or undersupply of cooling airflow. Oversupply of cooling airflow means waste in cooling energy and cooling capacity of the data center. Undersupply of cooling airflow results in IT equipment starving for cooling airflow, which could result in unreliable operation of IT equipment.

One common aspect in these decoupled control methods is the use of supply air temperature sensor to control the temperature of the air supplied by the cooling unit. Controlling the amount of air supplied to the data center however varies significantly between the different methods. Some of the ways used to control the amount of air supplied to the data center included using underfloor pressure, server or cabinet inlet temperatures, temperature difference across a containment, and containment pressure. If a data center includes only one containment system, some of these methods may succeed in reaching optimum control. Also, if a data center includes multiple containment systems that all have exactly the same heat load and airflow demand at all times, some of these methods may again succeed in reaching optimum control. However, a typical data center almost always has more than one containment system and it is rare to have the heat load and airflow demand the same for all containment systems at all times. In these situations, the existing control schemes fall short of optimum control for cooling units and result in unwanted cooling airflow bypass, which result in waste of cooling fan energy.

SUMMARY

In an embodiment, the present invention is a data center. The data center comprises a first datacenter POD including a first plurality of rows of cabinets where each of the first plurality of rows of cabinets are adjacent to and share a first cold aisle, the first cold aisle including a first temperature and a first pressure set point; a second datacenter POD including a second plurality of rows of cabinets where each of the second plurality of rows of cabinets are adjacent to and share a second cold aisle, the second cold aisle including a second temperature set point and a second pressure set point; a cold air supply connected to both the first cold aisle and the second cold aisle, the cold air supply providing a cold air flow having both a temperature and a volumetric flow rate associated therewith; a first active damper connected to and between the first cold aisle and the cold air supply; a second active damper connected to and between the second cold aisle and the cold air supply; and a controller connected to the cold air supply, the first active damper, and the second active damper, the controller controlling the temperature of the cold air flow, the controller further controlling the first active damper to partition the volumetric flow rate to approximately achieve the first pressure set point in the first cold aisle, the controller further controlling the second active damper to partition the volumetric flow rate to approximately achieve the second pressure set point in the second cold aisle.

DETAILED DESCRIPTION

One embodiment of the present invention is a cooling control solution for data centers with multiple cold aisle containment (CAC) PODs. A POD is defined as two rows of cabinets sharing a common cold aisle. The present invention includes a process that controls the amount of cooling airflow supplied by the cooling units and controls the amount of cooling airflow going into each CAC POD. The cooling control scheme closely matches the amount of air supplied by the cooling units to the amount of air required by the IT equipment while maintaining safe cabinet inlet temperatures (within threshold limits), to ensure safe and reliable operation of the IT equipment. The cooling control scheme also monitors and balances the amount of cooling airflow going into each POD.

Achieving optimum cooling control (lowest energy consumption while maintaining cabinet inlet air temperature within user defined threshold limits) in a data center with containment system can require independent control of cooling fan speed and cooling air temperature. The control scheme of the present invention decouples the control of the cooling unit; using at least one variable to control the amount of air provided by the cooling unit fan to the data center, and at least one other variable to control the temperature of the air supplied by the cooling unit.

With the use of the present invention, the data center manager/operator can reduce the amount of supplied cooling airflow and hence the cooling fan power consumption, while maintaining proper thermal environment for the IT equipment. The amount of cooling airflow saved can be used to cool additional IT equipment heat load (reclaim lost cooling capacity) that gets commissioned in future and hence helps in extending the life of the data center. The reduction in supplied cooling airflow also optimizes the cooling capacity usage by increasing the return air temperature to the cooling units.

Figure 1:
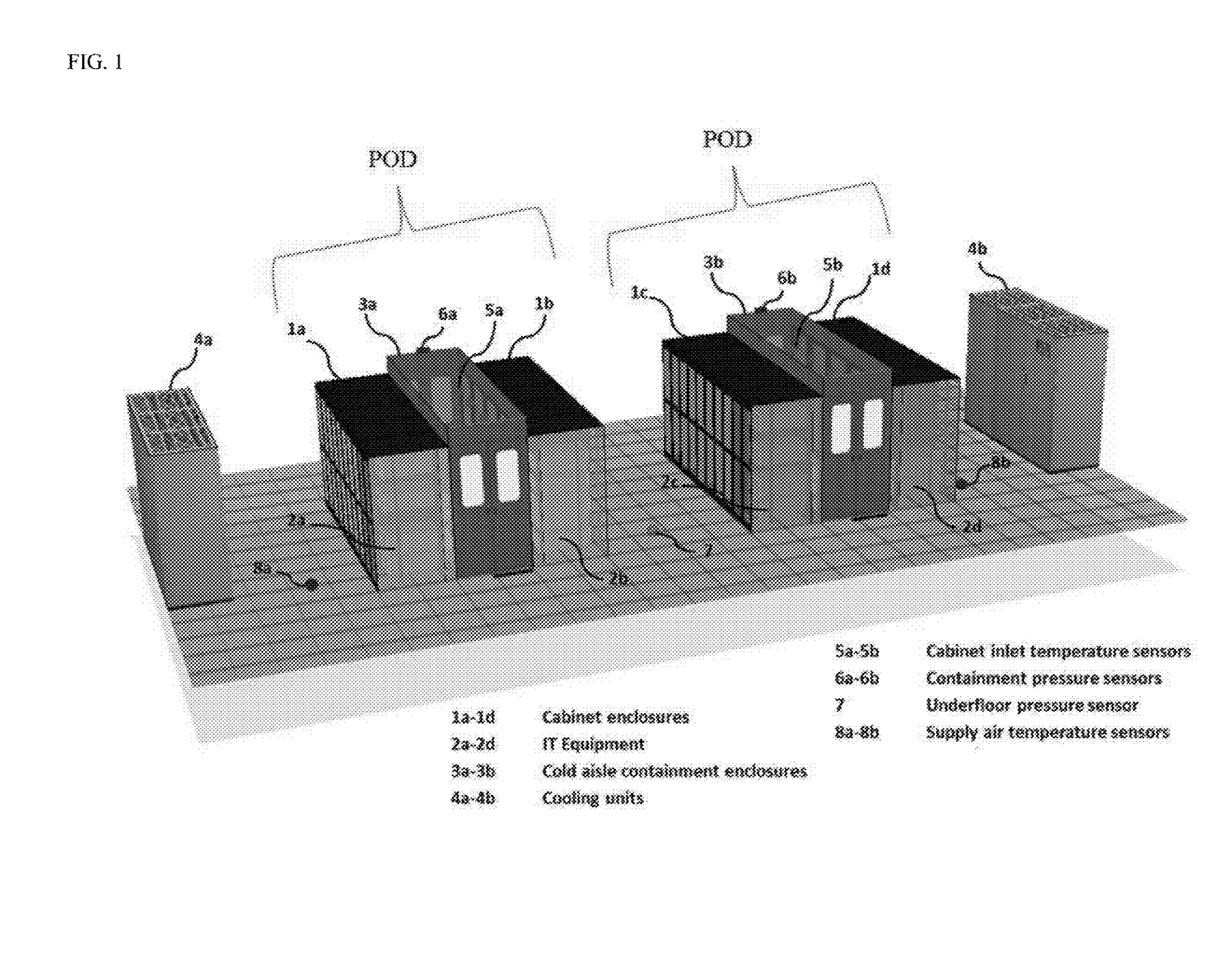
FIG. 1 is a perspective view of a data center with cold aisle containment systems according to an embodiment of the present invention.
Figure 2:
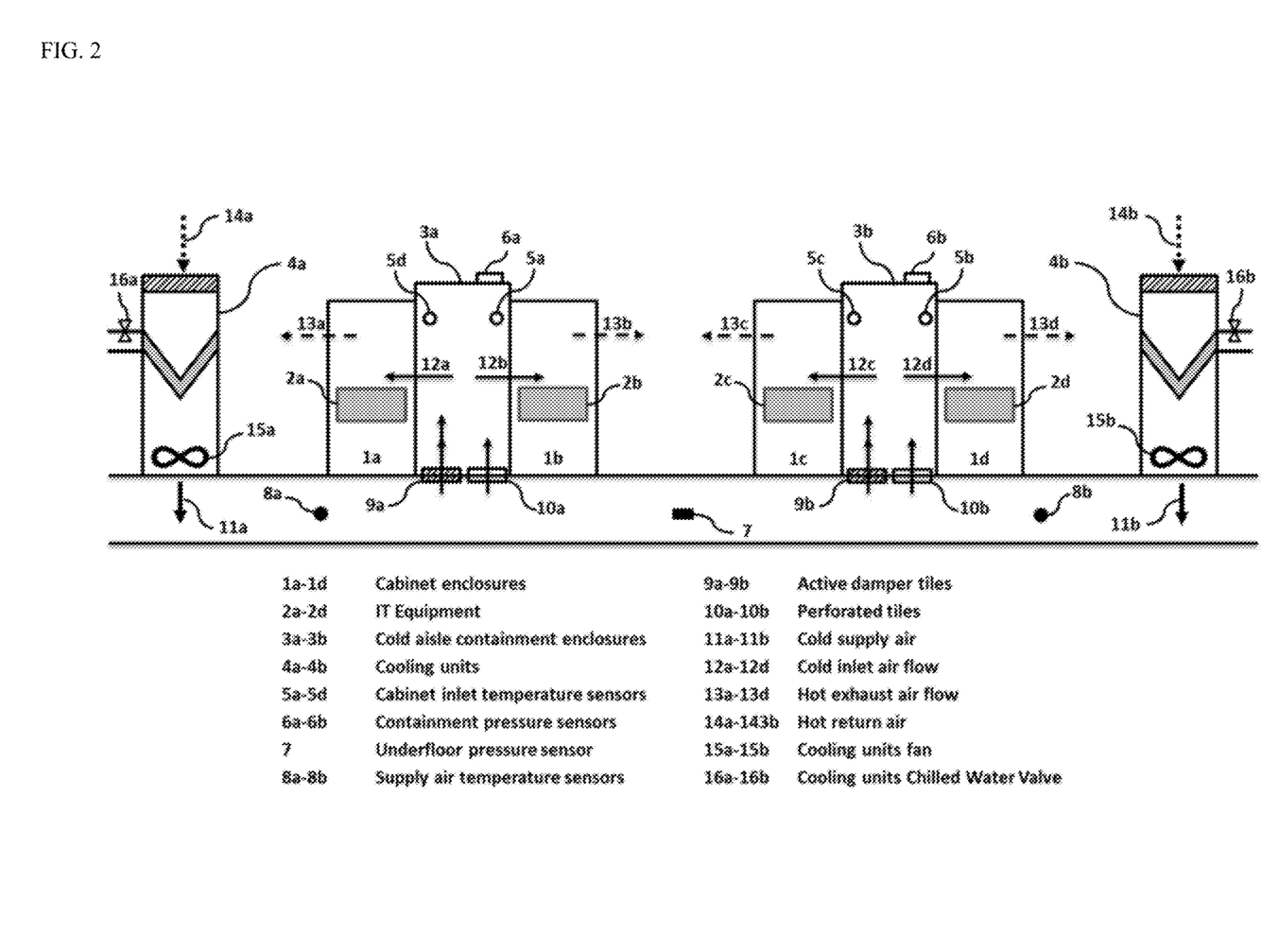
FIG. 2 is a schematic side view of the data center of FIG. 1.

FIG. 1 is an isometric view of a data center with two CAC PODs for an embodiment of the present invention, which includes cabinet enclosures 1a-1d that house IT equipment 2a-2d with cold aisle containment enclosures 3a-3b deployed for two separate PODs. The data center is cooled using two perimeter cooling units 4a-4b. Cabinet inlet temperature sensors 5a-5b are installed at the intake of each cabinet enclosure 1a-1d. Containment pressure sensors 6a-6b are installed in each cold aisle containment enclosure 3a-3b. The raised-floor plenum in the data center has underfloor pressure sensors 7 and supply air temperature sensors 8a-8b installed. FIG. 2 provides additional details of the data center described in FIG. 1. In FIG. 2, each of the two PODs described previously have a combination of active damper tiles 9a-9b and perforated tiles 10a-10b. The IT equipment 2a-2d are cooled by the cold supply air 11a-11b that is flooded into the underfloor plenum, which then enters each POD through its associated active damper tiles 9a-9b and perforated tiles 10a-10b. Cold inlet air flow 12a-12d enters the IT equipment 2a-2d to cool the IT equipment components and returns to the data center room air as hot exhaust air 13a-13d. The hot return air 14a-14b is drawn by the cooling unit fans 15a-15b through the cooling unit 4a-4b to be cooled once again and the cycle continues.

Figure 3:
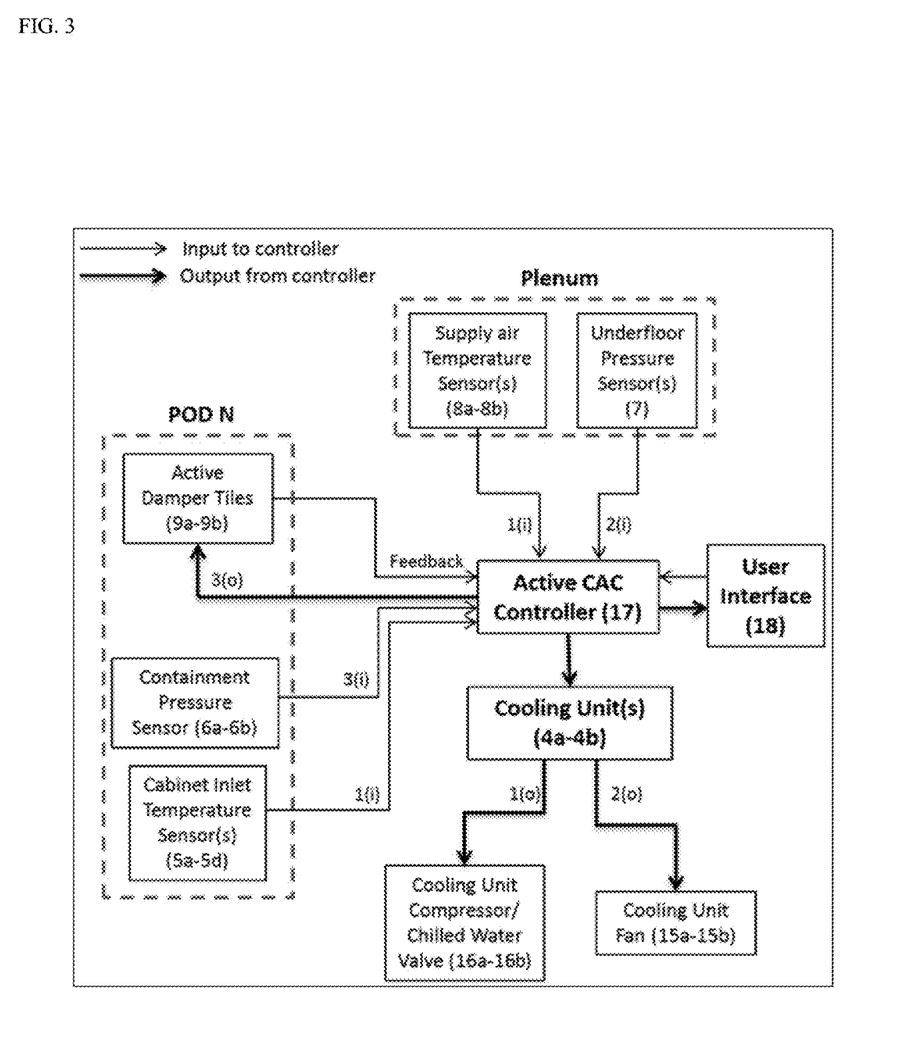
FIG. 3 is a block diagram of a cooling control system according to an embodiment of the present invention.

FIG. 3 is a block diagram of an embodiment of the present invention and its different components. The present invention includes an active CAC controller 17 which receives information from all the sensors deployed in the data center; cabinet inlet temperature sensors 5a-5d, containment pressure sensors 6a-6b, underfloor pressure sensors 7, and supply air temperature sensors 8a-8b as well as a system for receiving information from the active damper tiles 9a-9b on their position. Active CAC controller 17 interacts with the cooling units' fans 15a-15b and cooling units chilled water valves 16a-16b through the cooling units' 4a-4b and it interacts with a user interface 18 which allows the user to view all the data received by the active CAC controller 17 and input the desired set points for the different variables. The figure also details which specific sensor measurement inputs are used to control the active damper tiles 9a-9b, cooling units fans 15a-15b and cooling units chilled water valves 16a-16b. Input 1(i) from both supply air temperature sensors 8a-8b and cabinet inlet temperature sensors 5a-5d is used to control the cooling units chilled water valves 16a-16b opening through the output signal 1(o). Input 2(i) from the underfloor pressure sensors 7 are used to control the cooling unit fans 15a-15b speeds through the output signal 2(o). Input 3(i) from the containment pressure sensors 6a-6b is used to control the active damper tiles 9a-9b openings through the output signal 3(o).

Figure 4:
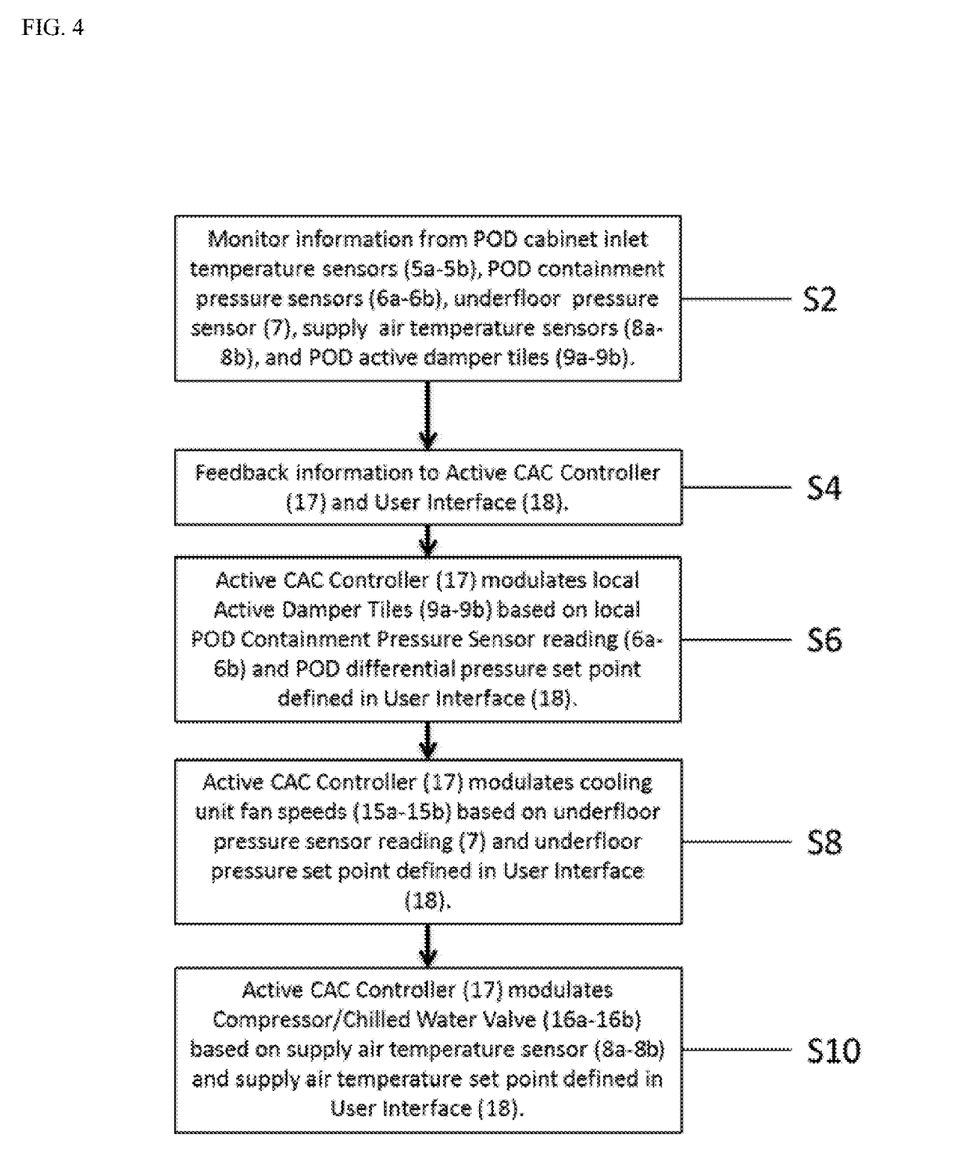
FIG. 4 is a flow chart of the cooling control system of FIG. 3.

FIG. 4 details the flow of an embodiment of the invented process. In step S2, the deployed sensors are constantly measuring different variables within the data center. In step S4, providing the information collected in step S2 to the active CAC controller 17 and the user interface 18. In Step S6, the active CAC controller 17 modulates local active damper tiles 9a-9b based on local POD containment pressure sensor reading 6a-6b and POD differential pressure set point defined in user interface 18. In Step S8, the active CAC controller 17 modulates cooling units' fans 15a-15b speed based on underfloor pressure sensor reading 7 and underfloor pressure set point defined in user interface 18. With airflow balanced between all PODs in the data center and the underfloor pressure set point satisfied, in step S10 the active CAC controller 17 modulates chilled water valve 16a-16b opening based on supply air temperature sensor reading 8a-8b and supply air temperature set point defined in user interface 18.

Using the above described process, airflow is matched in each CAC POD based on the IT equipment 2a-2d airflow demand in the respective POD to the air supplied by the cooling unit fans 15a-15b which ensures that minimum to none of the air supplied is wasted. This helps achieve the optimum control of the cooling unit fans 15a-15b which in turn reduces their energy consumption. In addition to energy savings, saving the amount of air flow supplied by the cooling unit fans 15a-15b also optimizes the cooling capacity usage of the cooling units 4a-4b, allowing to extend the life of the data center and enabling the use of the full designed capacity of the cooling units 4a-4b.

Figure 5:
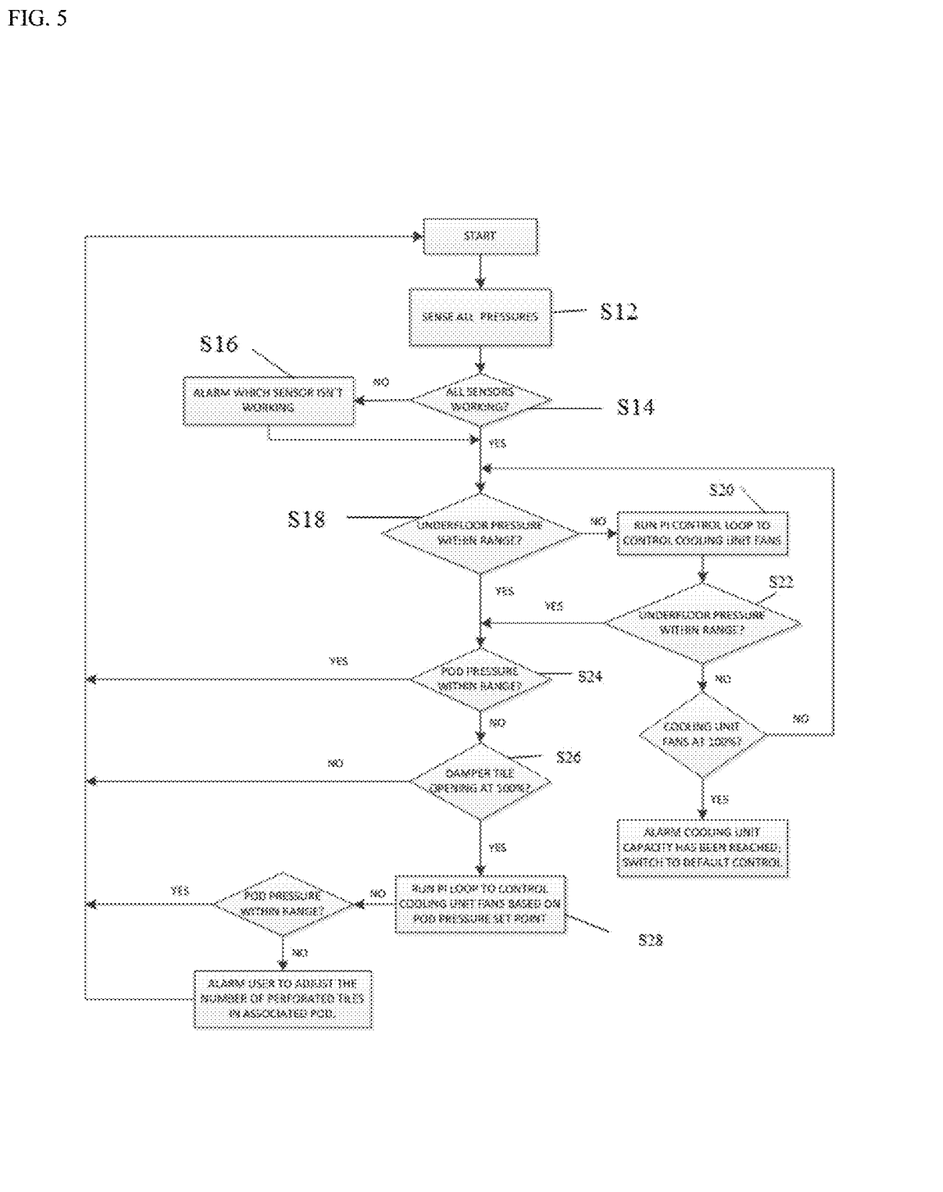
FIG. 5 is a flow chart of the cooling unit fan speed control of FIG. 4.

FIG. 5 details the flow chart for cooling unit fans 15a-15b speed control. In step S12, containment pressure sensor 6a-6b measurements, and underfloor pressure sensor 7 measurements are reported to the active CAC controller 17. In Step 14, the active CAC controller 17 checks if any of the pressure sensors are not working If a pressure sensor isn't working, an alarm is sent to the user interface 18 to report which sensor is not working in step S16. In step S18, the active CAC controller 17 checks if the underfloor pressure sensor 7 measurements match the underfloor pressure set point defined in user interface 18. If not, in step S20 a proportional integral control loop is used to control the cooling unit fans 15a-15b to maintain the underfloor pressure set point. If the underfloor pressure set point is satisfied in step S22, the active CAC controller 17 checks if all containment pressure sensor 6a-6b measurements match the containment pressure set point defined in user interface 18 in step S24. If the containment pressure sensor 6a-6b measurements do not match the set point in step S24, the active CAC controller 17 checks if the active damper tiles 9a-9b associated with the cold aisle containment enclosure 3a-3b that has a mismatch in pressure is at a 100% or 0% opening in step S26; if so, in step S28, active CAC controller 17 overrides the initial underfloor pressure set-point condition and controls the cooling unit fans 15a-15b speed based on the containment pressure sensor 6a-6b to maintain its set point.

Figure 6:
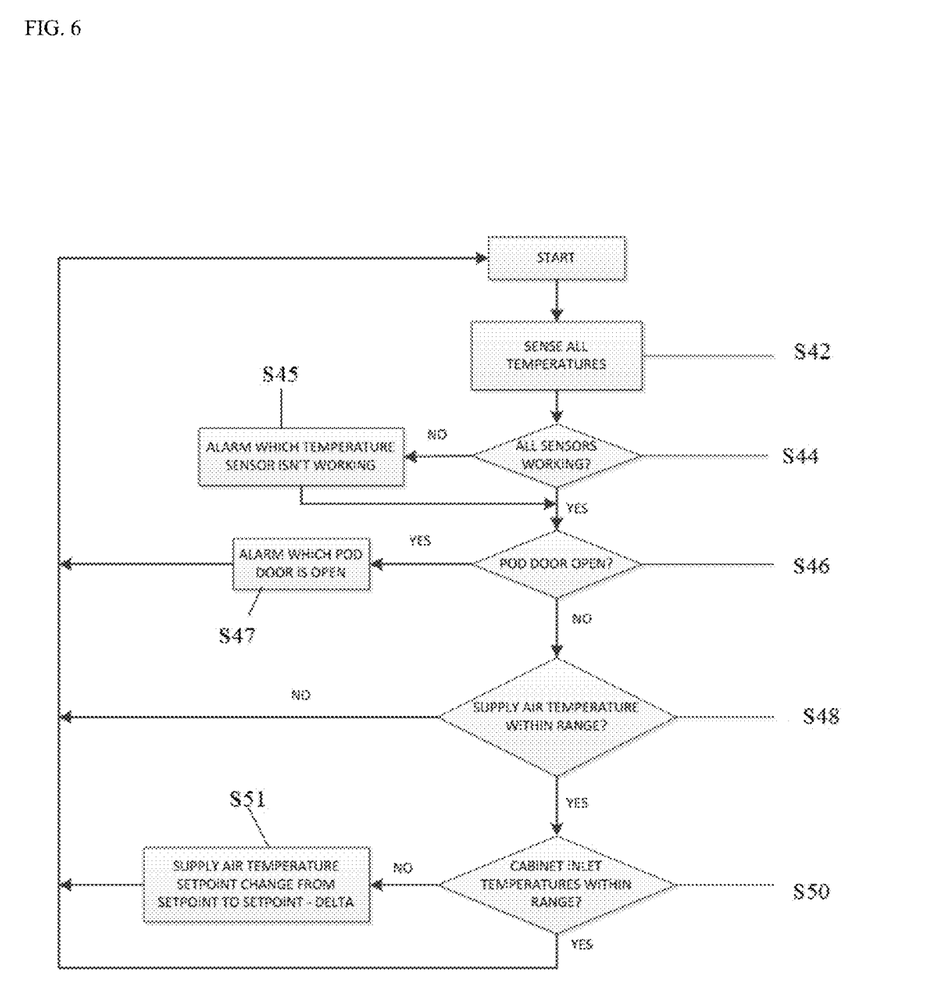
FIG. 6 is a flow chart of the supply air temperature set point control of FIG. 4.

FIG. 6 details the flow chart for the supply air temperature set point control. In step S42, all supply temperature sensors 8a-8b measurements, and cabinet inlet temperature sensor 5a-d measurements are reported to the active CAC controller 17. In step S44, the active CAC controller 17 checks if any of the temperature sensors are not working. If a temperature sensor isn't working, an alarm is sent to the user interface 18 in step S45 to report which sensor is not working. In S46 the active CAC controller 17 checks if a POD door is open. If so, an alarm is sent to the user interface 18 in step S47 to report which POD door is open and active controller 17 does not make any changes. If no POD door is open, the active CAC controller 17 checks if the supply air temperature sensor 7 measurement is within range of the supply air temperature set point in step S48. If not within range, the active CAC controller 17 does not make any changes, to wait for the cooling units chilled water valve 16a-16b to regulate based on the supply air temperature set point. If within range, in step S50 the active CAC controller 17 checks if all cabinet inlet temperature sensor 5a-5d measurements are within range of the cabinet inlet temperature set point. If yes, the active CAC controller 17 does not make any changes. If no, in step S51 active CAC controller 17 changes the supply air temperature set point defined in the user interface 18 by a delta value defined in the user interface 18.

In an another embodiment according to the present invention, the cooling units 4a-4b illustrated in FIG. 1 and FIG. 2 can be replaced with large air handling units that are physically located outside of the data center. However, cold air supply to the data center and warm air exhaust from the data center are in a similar fashion as depicted in FIG. 1 and FIG. 2.

In an another embodiment according to the present invention, the cooling units 4a-4b illustrated in FIG. 1 and FIG. 2 can be direct expansion (DX) cooling units that utilize a compressor for cooling instead of the chilled water supply. In this case, the cooling capacity is regulated by a compressor speed instead of a chilled water valve opening.

In an another embodiment according to the present invention, the cooling units 4a-4b illustrated in FIG. 1 and FIG. 2 can be equipped with air-side economization and/or evaporative cooling capability. In this case, the cooling capacity is regulated using supply air set point temperature and outside ambient air condition.

Figure 7:
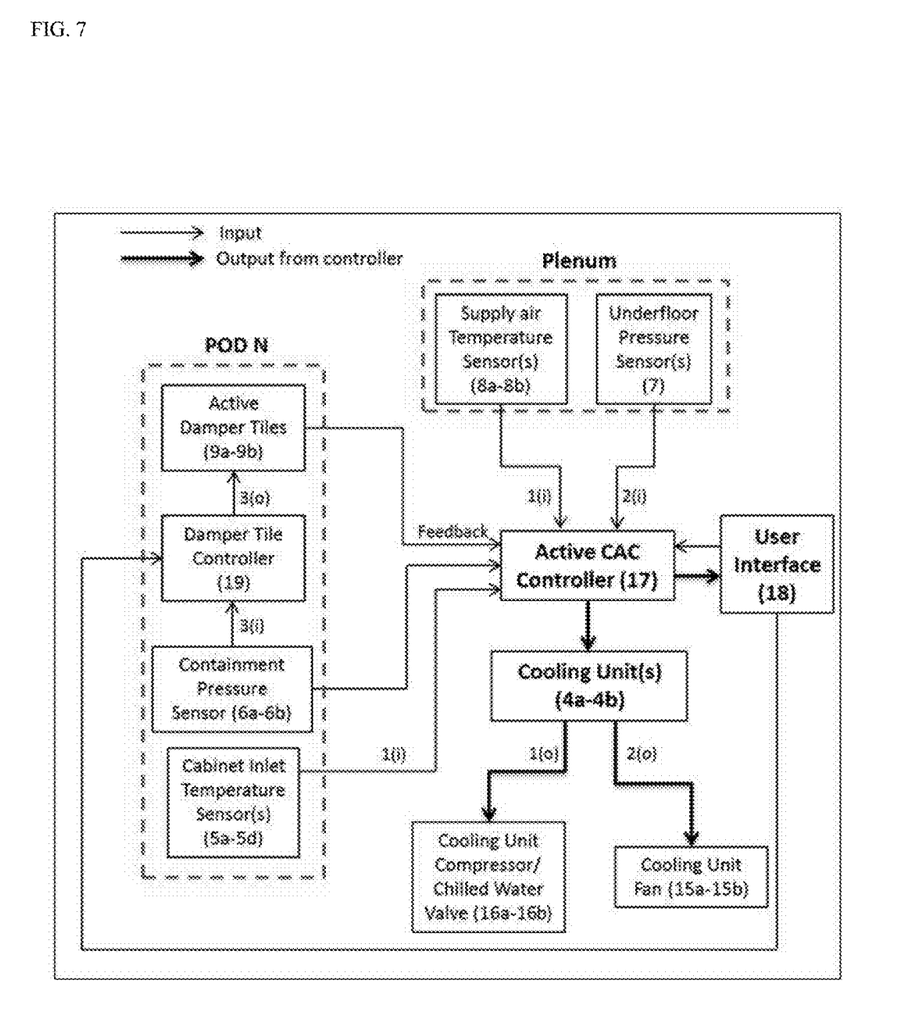
FIG. 7 is a block diagram of a cooling control system according to an alternative embodiment of the present invention.

In an another embodiment according to the present invention, the active damper tiles 9a-9b are controlled through a damper tile controller 19 instead of the active CAC controller 17, based on a user specified set point through the user interface 18. All other aspects of the present invention remain the same. FIG. 7 is a block diagram of the present invention in the separate described embodiment.

Note that while this invention has been described in terms of several embodiments, these embodiments are non-limiting (regardless of whether they have been labeled as exemplary or not), and there are alterations, permutations, and equivalents, which fall within the scope of this invention. Additionally, the described embodiments should not be interpreted as mutually exclusive, and should instead be understood as potentially combinable if such combinations are permissive. It should also be noted that there are many alternative ways of implementing the methods and apparatuses of the present invention. It is therefore intended that claims that may follow be interpreted as including all such alterations, permutations, and equivalents as fall within the true spirit and scope of the present invention.

We claim:

1. A data center, comprising:
a first datacenter POD including a first plurality of rows of cabinets where each of said first plurality of rows of cabinets are adjacent to and share a first contained cold aisle, said first contained cold aisle including a first pressure sensor having a first pressure set point;
a second datacenter POD including a second plurality of rows of cabinets where each of said second plurality of rows of cabinets are adjacent to and share a second contained cold aisle, said second contained cold aisle including a second pressure sensor having a second pressure set point;
an underfloor cold air supply plenum connected to both said first contained cold aisle and said contained second cold aisle, said underfloor cold air supply plenum including a third pressure sensor having a third pressure set point;
a first active damper floor tile connected to and between said first contained cold aisle and said cold air supply;
a second active damper floor tile connected to and between said second contained cold aisle and said cold air supply and;
a controller connected to said cold air supply, said first active damper, and said second active damper floor tile, said controller to:
determine, based on pressure sensor data received from the third pressure sensor, that pressure in the underfloor cold air supply plenum matches the third pressure set point in the underfloor cold air supply plenum; in response to determining that the pressure in the underfloor cold air supply plenum matches the third pressure set point, determine, based on pressure sensor data received from the first pressure sensor, that pressure in the first contained cold aisle does not match the first pressure set point in the first contained cold aisle; in response to determining that the pressure in the first contained cold aisle does not match the first pressure set point, determine whether the first active damper floor tile is 100% opened; and in response to determining that the first active damper floor tile is 100% opened: override the third pressure set point in the underfloor cold air supply plenum; and control, based on the pressure sensor data received from the first pressure sensor, a fan speed of a fan in a cooling unit in the data center to achieve the first pressure set point in the first contained cold aisle.

2. The data center of claim 1, wherein said underfloor cold air supply plenum provides a cold air flow having both a temperature and a volumetric flow rate associated therewith, the temperature of said cold air flow being controlled by said controller based on at least one of a first temperature set point in the first contained cold aisle and a second temperature set point in the second contained cold aisle.

3. The data center of claim 1, wherein said cold air supply includes at least one of a supply air temperature sensor and a supply air pressure sensor.

4. The data center of claim 3, wherein at least one of said supply air temperature sensor and said supply air pressure sensor is a wireless sensor.

5. The data center of claim 1, wherein said first contained cold aisle and said second contained cold aisle includes at least one of a cabinet inlet temperature sensor.

6. The data center of claim 5, wherein said cabinet inlet temperature sensor is a wireless sensor.

7. The data center of claim 1, wherein at least one of said first active damper floor tile and said second active damper floor tile is powered using a power over Ethernet device.

8. A method for cooling a data center, the method performed by an active cold aisle containment (CAC) controller and comprising:

determining, based on pressure sensor data received from a first pressure sensor included in an underfloor cold air supply plenum, whether pressure in the underfloor cold air supply plenum matches a first pressure set point in the underfloor cold air supply plenum;

in response to determining that the pressure in the underfloor cold air supply plenum matches the first pressure set point, determining, based on pressure sensor data received from a second pressure sensor included in a first contained cold aisle in the data center, whether pressure in the first contained cold aisle matches a second pressure set point in the first contained cold aisle; and determining, based on pressure sensor data received from a third pressure sensor included in a second contained cold aisle in the data center, whether pressure in the second contained cold aisle matches the third pressure set point;

in response to determining that the pressure in the first contained cold aisle does not match the second pressure set point, determining whether an active damper tile associated with the first contained cold aisle is 100% opened; and in response to determining that the active damper tile associated with the first contained cold aisle is 100% opened:

overriding the first pressure set point in the underfloor cold air supply plenum; and controlling, based on the pressure sensor data received from the second pressure sensor, fan speed of fans in a cooling unit to achieve the second pressure set point in the first contained cold aisle.

9. The method of claim 8, comprising:
in response to determining that the pressure in the underfloor cold air supply plenum does not match the first pressure set point, controlling the fan speed of the fans in the cooling unit in the data center to achieve the first pressure set point in the underfloor cold air supply plenum based on the pressure sensor data received from the first pressure sensor.

10. The method of claim 8, comprising:
in response to determining that the pressure in the first contained cold aisle does not match the second pressure set point, determining whether at least one of the active damper tile associated with the first contained cold aisle and a second active damper tile associated with the second contained cold aisle is 100% opened.

11. The method of claim 10, comprising:
in response to determining that at least one of the active damper tile associated with the first contained cold aisle and the second active damper tile associated with the second contained cold aisle is 100% opened:

overriding the first pressure set point in the underfloor cold air supply plenum; and controlling, based on the pressure sensor data received from the second pressure sensor and pressure sensor data received from the third pressure sensor, the fan speed of the fans in the cooling unit to achieve the second pressure set point in the first contained cold aisle and the third pressure set point the second contained cold aisle.

12. A data center cooling control system, comprising:
a plurality of cooling units;
at least a first active damper floor tile and a first pressure sensor included in a first contained cold aisle in the data center;

at least a second active damper floor tile and a second pressure sensor included in a second contained cold aisle in the data center;

a third pressure sensor included in an underfloor cold air supply plenum in the data center; and an active cold aisle containment (CAC) controller to:
determine, based on pressure sensor data received from the third pressure sensor, that pressure in the underfloor cold air supply plenum matches a first pressure set point in the underfloor cold air supply plenum;

in response to determining that the pressure in the underfloor cold air supply plenum matches the first pressure set point, determine, based on pressure sensor data received from the first pressure sensor, that pressure in the first contained cold aisle does not match a second pressure set point in the first contained cold aisle;

in response to determining that the pressure in the first contained cold aisle does not match the second pressure set point, determine whether the first active damper floor tile is 100% opened; and in response to determining that the first active damper floor tile is 100% opened:
override the first pressure set point in the underfloor cold air supply plenum; and control, based on the pressure sensor data received from the first pressure sensor, fan speed of fans in the plurality of cooling units to achieve the second pressure set point in the first contained cold aisle.

13. The data center cooling system of claim 12, wherein the active CAC controller is to:
after overriding the first pressure set point in the underfloor cold air supply plenum and controlling the fan speed of fans in the plurality of cooling units to achieve the second pressure set point in the first contained cold aisle, determine, based on the pressure sensor data received from the first pressure sensor, whether the pressure in the first contained cold aisle matches the second pressure set point.

14. The data center cooling system of claim 13, wherein the active CAC controller is to:
in response to determining that the pressure in the first contained cold aisle does not match the second pressure set point after overriding the first pressure set point in the underfloor cold air supply plenum and controlling the fan speed of fans in the plurality of cooling units to achieve the second pressure set point in the first contained cold aisle, sending an alarm to a user interface of the data center cooling system to adjust a number of active damper floor tiles associated with the first contained cold aisle.

15. The data center cooling system of claim 12, wherein the active CAC controller is to:
determine, based on the pressure sensor data received from the third pressure sensor, that the pressure in the underfloor cold air supply plenum does not match the first pressure set point in the underfloor cold air supply plenum; and in response to determining that the pressure in the underfloor cold air supply plenum does not match the first pressure set point, control the fan speed of the fans in the plurality of cooling units in the data center to achieve the first pressure set point in the underfloor cold air supply plenum based on the pressure sensor data received from the third pressure sensor.

16. The data center cooling system of claim 12, wherein the active CAC controller is to:

control, based on the pressure sensor data received from the first pressure sensor, the first active damper floor tile to partition a volumetric flow rate of a cold air flow to achieve the second pressure set point in the first contained cold aisle;

control, based on the pressure sensor data received from the second pressure sensor, the second active damper floor tile to partition the volumetric flow rate to achieve a third pressure set point in the second contained cold aisle; and control, based on the pressure sensor data received from the third pressure sensor, the fan speed of the fans in the plurality of cooling units in the data center to achieve the first pressure set point in the underfloor cold air supply plenum.

* * * * *